United States Patent
Zhang et al.

(10) Patent No.: US 9,984,909 B1
(45) Date of Patent: May 29, 2018

(54) SYSTEM AND METHOD FOR LASER SCRIBING A SOLAR PANEL AND THE SOLAR PANEL

(71) Applicant: The Chinese University of Hong Kong, Hong Kong (CN)

(72) Inventors: Xiaofu Zhang, Hong Kong (CN); Shihang Yang, Hong Kong (CN); Jinlong Gao, Hong Kong (CN); Jiakuan Zhu, Hong Kong (CN); Kefan Wang, Hong Kong (CN); Xudong Xiao, Hong Kong (CN)

(73) Assignee: The Chinese University of Hong Kong, Hong Kong (CN)

( * ) Notice: Subject to any disclaimer, the term of this patent is extended or adjusted under 35 U.S.C. 154(b) by 0 days. days.

(21) Appl. No.: 15/455,376

(22) Filed: Mar. 10, 2017

(51) Int. Cl.
| | |
|---|---|
| *H01L 21/00* | (2006.01) |
| *B23K 26/00* | (2014.01) |
| *H01L 21/67* | (2006.01) |
| *H01L 23/544* | (2006.01) |
| *B23K 26/359* | (2014.01) |
| *G06T 7/73* | (2017.01) |
| *G06T 7/00* | (2017.01) |
| *H01L 31/18* | (2006.01) |
| *B23K 101/36* | (2006.01) |
| *H04N 5/372* | (2011.01) |

(52) U.S. Cl.
CPC .... *H01L 21/67282* (2013.01); *B23K 26/0087* (2013.01); *B23K 26/359* (2015.10); *G06T 7/0006* (2013.01); *G06T 7/74* (2017.01); *H01L 23/544* (2013.01); *B23K 2201/36* (2013.01); *G06T 2207/20221* (2013.01); *G06T 2207/30148* (2013.01); *H01L 31/18* (2013.01); *H01L 2223/5446* (2013.01); *H04N 5/372* (2013.01)

(58) Field of Classification Search
CPC ............ H01L 21/67282; H01L 23/544; B23K 26/359; B23K 26/0087; G06T 7/74
USPC .......................................... 438/5; 219/121.72
See application file for complete search history.

(56) References Cited

U.S. PATENT DOCUMENTS

| | | | |
|---|---|---|---|
| 2010/0089884 A1* | 4/2010 | Sercel ................... | B23K 26/16 219/121.72 |
| 2011/0253685 A1* | 10/2011 | Hsu ...................... | B23K 26/046 219/121.67 |

(Continued)

OTHER PUBLICATIONS

Rekow et al.; "CIGS P1, P2, P3 Scribing Processes using a Pulse Programmable Industrial Fiber Laser"; National Renewable Energy Laboratory; Sep. 6-10, 2010; 13 pages.

(Continued)

*Primary Examiner* — David S Blum
(74) *Attorney, Agent, or Firm* — Fish & Richardson P.C.

(57) ABSTRACT

The present application discloses methods, and systems for laser-scribing a solar panel and the solar panels. The method for laser-scribing the solar panel may comprise: capturing consecutively images of parts of a first line on the solar panel, the first line having a pre-designed shape; acquiring location information of each of the captured images of the first line; and laser-scribing parts of a second line on the solar panel consecutively, according to the acquired location information of the first line, so that the scribed second line has the pre-designed shape of the first line and maintains a fixed distance from the first line.

17 Claims, 7 Drawing Sheets

(56) References Cited

U.S. PATENT DOCUMENTS

| | | | |
|---|---|---|---|
| 2016/0158890 A1* | 6/2016 | Gonzalez | H01L 22/26 438/5 |
| 2017/0157701 A1* | 6/2017 | Sercel | B23K 26/0087 |
| 2017/0229604 A1* | 8/2017 | Kwong | H01L 31/1876 |

OTHER PUBLICATIONS

Witte et al.; "Investigation of a reliable "all laser" scribing Process in Thin Film Cu(In,Ga)(S,Se)2 Manufacturing"; Proc. of SPIE, vol. 8607; 2013; 18 pages.
Heise et al.; "Ultrafast lasers improve the efficiency of CIS thin film solar cells"; SciVerse ScienceDirect; 2012; pp. 702-708.
Pern et al.; "All-Laser Scribing for Thin-Film CuInGaSe$_2$ Solar Cells"; IEEE; 2010; 6 pages.
Kim et al.; "Comparison of multilayer laser scribing of thin film solar cells with femto, pico and nanosecond pulse durations"; Proc. of SPIE vol. 7409; 2009; 10 pages.
Ku et al.; "Electrical characterization of P3 isolation lines patterned with a UV laser incident from the film side on thin-film silicon solar cells"; Department of Physics, Shanghai Jiao Tong University; 2012; 6 pages.
Ruthe et al.; "Etching of CuInSe$_2$ thin films—comparison of femtosecond and picosecond laser ablation"; Applied Surface Science 247; 2005; pp. 447-452.
Zimmer et al.; "Excimer laser etching of GaAs, Al$_x$ Ga$_{1-x}$ As and CuInSe$_2$ in chlorine atmosphere"; Applied Surface Science 127-129; 1998; pp. 800-804.
Chichkov et al.; "Femtosecond, picosecond and nanosecond laser ablation of solids"; Appl. Phys. A 63,1996; pp. 109-115.
Horvath et al.; "Focused ion beam based sputtering yield measurements on ZnO and Mo thin films" ScienceDirect; 2007; pp. 392-397.
Yavas et al.; "High-speed maskless laser patterning of indium tin oxide thin films"; Applied Physics Letters; vol. 73, No. 18, Nov. 2, 1998; 3 pages.
Rekow et al.; "Impact of P2 Scribe Geometry on Monolithic Series Interconnected CIGS Modules"; Proc. of SPIE vol. 8601; 2013; 9 pages.
Hernandez et al.; "Investigation of CIS/CIGS and CdTe solar cells scribing with high power fibre short pulse lasers"; Proc. of SPIE; vol. 8438; 2012; 11 pages.
Heise et al.; "Investigation of the ablation of zinc oxide thin films on copper-indium-selenide layers by ps laser pulses"; Appl. Phys. A; 2011; 104:387-393.
Sozzi et al.; "Laser micromachining of thin film materials"; Optical Systems for the Energy & Production Industries; EOS Annual Meeting; 2012; 2 pages.
Westin; "By Means of Beams, Laser Patterning and Stability in CIGS Thin Film Photovoltaics"; Digital Comprehensive Summaries of Uppsala Dissertations from the Faculty of Science and Technology; 2011; 74 pages.
Westin et al.; "Laser patterning of P2 interconnect via in thin-film CIGS PV modules"; Solar Energy Materials & Solar Cells 92; 2008; pp. 1230-1235.
Compaan et al.; "Laser scribing of polycrystalline thin films"; Optics and Lasers in Engineering, 34; 2000; pp. 15-45.
Raciukaitis; "Laser structuring of conducting films on transparent substrates for electronics devices"; Proc. of SPIE, vol. 7142; 2008; 15 pages.
Gecys et al.; "Variation of P2 series interconnects electrical conductivity in the CIGS solar cells by picosecond laser-induced modification"; ScienceDirect; Solar Energy 132; 2016; pp. 493-502.
Burn et al.; "All fiber laser scribing of Cu(In,Ga)Se$_2$ thin-film solar modules"; SciVerse SicenceDirect; Physics Procedia 41; 2013; pp. 713-722.
Heise et al.; "Optimization of picosecond laser structuring for the monolithic serial interconnection of CIS solar cells"; Progress in Photovoltaics; 2013; pp. 681-692.
Westin et al.; "Materials Analysis of Laser Treated CIGS"; 23rd European Photovoltaic Solar Energy Conference and Exhibition, Sep. 1-5, 2008, Valencia, Spain; 4 pages.
Lemke et al.; "Picosecond laser induced selective removal of functional layers on CIGS thin film solar cells"; SciVerse ScienceDirect; Physics Procedia 41; 2013; pp. 762-768.
Raciukaitis et al.; "Picosecond-Laser Structuring of Thin Films for CIGS Solar Cells"; Proceedings of LAMP 2009—the 5th International Congress on Laser Advanced Materials Processing; 6 pages.
Hwang et al.; "Scribing of thin film solar cells by picosecond and nanosecond pulsed lasers and performance improvement by gas injection"; Proc. of SPIE, vol. 8607; 2013; 6 pages.
Dhere et al.; "Review of laser material interaction to improve CIGSeS thin film solar cells"; Proc. of SPIE, vol. 8473; 2012; 7 pages.
Gecys et al.; "Scribing of Thin-film Solar Cells with Picosecond Laser Pulses"; ScienceDirect; Physics Procedia 12; 2011; pp. 141-148.
Burn et al.; "Selective ablation of thin films in latest generation CIGS solar cells with picosecond pulses"; Proc. of SPIE, vol. 8243; 2012; 17 pages.

* cited by examiner

SYSTEM AND METHOD FOR LASER SCRIBING A SOLAR PANEL AND THE SOLAR PANEL

TECHNICAL FIELD

The present application relates to a system and a method for laser-scribing a solar panel and the solar panel, and more specifically, to a system and a method for laser-scribing lines with arbitrary shaped patterns on a solar panel and the solar panel.

BACKGROUND OF THE APPLICATION

Normally, a solar panel, such as a thin film solar panel is formed by monolithically inter-connected cells using mechanical/laser scribing. FIG. 1 illustrates a conventional laser-scribing process for a CIGS solar module in the prior art. As shown in FIG. 1, there are totally three scribing lines, i.e., P1, P2 and P3 lines. Firstly, a Mo film is isolated by laser-scribing into equally spaced strips which have a width of 5 mm. The width of P1 line is about 20-70 μm. Then, a CIGS absorption layer, CdS and i-ZnO films are deposited on the Mo film. Additional P2 line is scribed right next to the P1 line to get rid of CIGS, CdS and i-ZnO films. The width of the P2 line is about 30-100 nm, depending on the scribing condition. Deposition of AZO front contact leads to inter-connection of front contact of the cell on the left to the back contact of the cell on the right side of P2 line. A P3 line with a width similar to that of P2 line is used to isolate the front contact connections among different cell strips. The cell strips are inter-connected into a whole module. The area from P1 to P3 lines is called dead area because of the wasted solar radiation. If P2 and P3 lines are scribed mechanically, the whole dead area is commonly about 0.2-0.3 mm; and if they are scribed by using laser-scribing techniques, the whole dead area may be reduced to less than 0.2 mm (0.14-0.2 mm). However, the P1, P2 and P3 lines are usually simple straight lines separated side by side in the prior art, which cannot satisfy the market requirements for product customization.

In addition, for the thin film solar panel on a flexible substrate, such as polyimide, it is very difficult to scribe patterns by using conventional laser-scribing techniques. Because even if the P1 line on a Mo back contact layer is straight at first, it will bend in the followed processes since the substrate may suffer from the thermal distortion. Then, if the P2 line will be scribed next to the bent P1, a crossover will easily occur. The same situations will also arise for the P2 and P3 lines. Therefore, the yield and the total power efficiency of the solar panel are greatly reduced.

There is therefore a need for a practical approach to address at least one of the above mentioned problems.

SUMMARY OF THE APPLICATION

With the system and method for laser-scribing the solar panel provided in the present application, the arbitrary patterns serving the function of solar panel can be designed freely and the artistic quality on the substrates with different sizes and shapes can be increased, thereby making the produced solar panels more convenient and attractive to consumers and improving the yield and efficiency of the solar panel. The system and method for laser-scribing the solar panel are applied for the thin film solar panel based on CIGS, CZTS, CdTe solar cells etc, and solar panels based on rigid substrates such as glass, or based on flexible substrates such as polyimide, Ti foils and stainless steel foils etc. With the system and method for laser-scribing the solar panel according to the present application, the best efficiency of CIGS modules fabricated by laser-scribing can be achieved as high as 14.25% (on glass) and 10.35% (on polyimide).

One aspect of the present application discloses a method for laser-scribing a solar panel. The method comprises capturing consecutively images of parts of a first line on the solar panel, the first line having a pre-designed shape; acquiring location information of each of the captured images of the first line; and laser-scribing consecutively parts of a second line on the solar panel, according to the acquired location information of the first line, so that the scribed second line has the pre-designed shape of the first line and maintains a fixed distance from the first line.

Another aspect of the present application discloses a system for laser-scribing a solar panel. The system comprises a capturer capturing consecutively images of parts of a first line on the solar panel, the first line having a pre-designed shape; an acquirer acquiring location information of each of the captured images of the first line and a laser scriber for laser-scribing consecutively parts of a second line on the solar panel, according to the acquired location information of the first line, so that the scribed second line has the pre-designed shape of the first line and maintains a fixed distance from the first line.

Another aspect of the present application discloses a system for laser-scribing a solar panel. The system comprises an imaging device capturing consecutively images of parts of a first line on the solar panel, the first line having a pre-designed shape; a transforming device transforming pixels coordinates of the captured images into scribing coordinates of each part to acquire the location information and a laser scriber laser-scribing consecutively parts of a second line on the solar panel, according to the acquired location information of the first line, so that the scribed second line has the pre-designed shape of the first line and maintains a fixed distance from the first line.

Still another aspect of the present application discloses a solar panel comprising lines laser scribed by the above mentioned method.

Still another aspect of the present application discloses a storage medium readable by a computer encoding a computer program for execution by the computer to carry out the above mentioned method for laser-scribing a solar panel.

BRIEF DESCRIPTION OF THE DRAWING

Other features, objects and advantages of the present application will become more apparent from a reading of the detailed description of the non-limiting embodiments, said description being given in relation to the accompanying drawings, among which.

DETAILED DESCRIPTION

The present application will be further described in detail in conjunction with the accompanying drawings and embodiments. It should be understood that the specific embodiments described herein are provided to illustrate the present application, instead of limiting the present application. It also should be noted that only parts related to the present application are shown in the figures for convenience of description.

It should be noted that, the embodiments of the present application and the features in the present application, on a non-conflict basis, may be combined with each other. The present application will be further described in details below in conjunction with the accompanying drawings and embodiments.

Disclosed herein are systems and methods for laser-scribing a solar panel with arbitrary shaped patterns. According to the present application, tracing and positioning abilities of the laser are used to control the movement of the laser, so that the formed patterns not only serve the function of solar panels but also provide flexibility for artistic design for consumer electronic products, thereby increasing the artistic quality on substrates with different sizes and shapes, making the products more convenient and attractive to consumers and improving yield and total power efficiency.

Figure 1:
FIG. 1 illustrates a conventional laser-scribing process for a CIGS solar module in the prior art.
Figure 2:
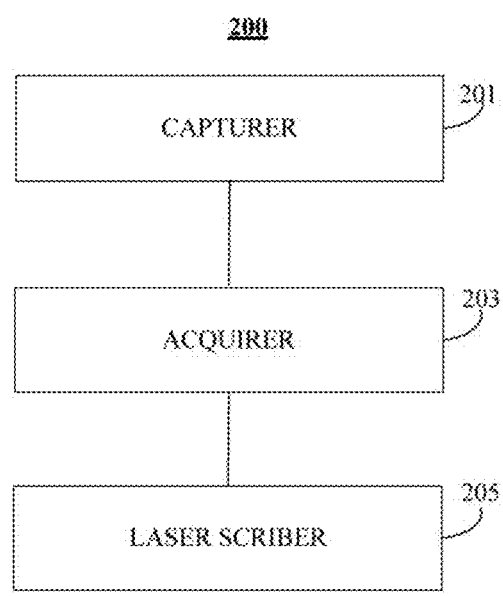
FIG. 2 illustrates a schematic block diagram of a system for laser-scribing according to an embodiment of the present application.

Referring initially to FIG. 2, a system 200 for laser-scribing the solar panel according to an embodiment of the present application is illustrated.

The system 200 includes a capturer 201, an acquirer 203, and a laser scriber 205. The capturer 201 may capture images of parts of a first line on the solar panel consecutively, wherein the first line has a pre-designed shape. The acquirer 203 may acquire location information of each of the captured images of the first line. According to each of the location information of the first line acquired by the acquirer 203, the laser scriber 205 may laser scribe parts of a second line on the solar panel consecutively, so that the scribed second line has the pre-designed shape and maintains a fixed distance from the first line.

In an embodiment, the first line may be a P1 line and the second line may be a P2 line. The laser scriber 205 may scribe the lined by using the laser beams. The deflection direction of the laser beams may be guided and controlled by a scanning galvanometer which is controlled by the computer. The P3 line may be laser scribed in a similar way as described above.

Figure 9:
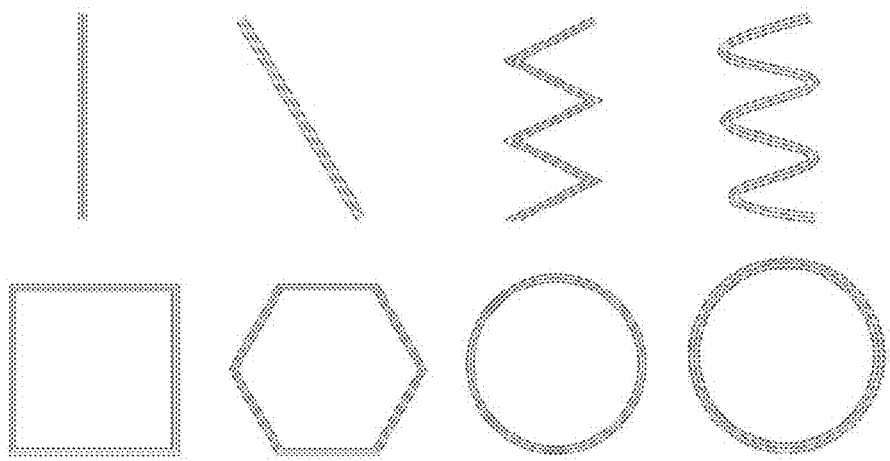
FIG. 9 illustrates exemplary patterns of three lines that are laser scribed on a thin film solar panel according to an embodiment of the present application.

In an embodiment, the arbitrary shaped patterns of the first line may be pre-designed by graphic software. The pre-designed patterns may include, but not limited to, wave-like patterns, round patters, rectangular, polygon patterns, etc. The exemplary patterns of three lines that are laser scribed on a thin film solar panel are illustrated in FIG. 9. In an embodiment, the capturer may be a high-speed CCD camera, which may be controlled by the computer to capture images along the track of the P1 line. In an embodiment, the tracking data may be input to the computer to be processed.

In an embodiment of the present application, the acquirer 203 may further include an extractor 2031 and a transformer 2032. The extractor 2031 may extract pixel coordinates of the captured images of parts of the first line, and the transformer 2032 may transform the extracted pixel coordinates into scribing coordinates of parts to acquire the location information. In an embodiment, the pixel coordinates of the first line (such as, P1 line) may be decomposed into a translation and a vibration of X-Y direction. The translation of X-Y direction may be obtained by two linear displacement platforms in X-Y direction, and the vibration may be realized by the reciprocating rotation of a vibrating mirror. For example, a slash is a combination of the X and Y directions shift; a wave line can be considered as a result of the superposition of the periodic motion of the galvanometer based on the displacement of the X and Y directions; and a circular may be decomposed into combination of the X and Y directions. In this connection, the trace of the laser can be achieved by the X-Y moving platform and the motion of the vibrating mirror. At the same time, the switch of the laser may be controlled by the computer, and the switch signal is triggered at the required position. In this way, the trace design, decomposition and streak motion of arbitrary shaped patterns can be achieved.

In another embodiment of the present application, a displacement produced by movement of a capturer (such as a CCD camera) for capturing each image (exposure time and recording time) is not more than one corresponding pixel distance, so that the process of the laser-scribing can be realized to accurately position corresponding to each image presented in real time. Otherwise, the process of image recording can only be done when the movement of the camera is stopped. So the whole speed of the process is restricted by the exposure and recording time of CCD camera. A sufficiently bright light source and a high-speed CCD camera are needed.

In an embodiment, the captured images may be pre-treated, such as pre filtered, serious salt and pepper noise removed and balanced light conditions lead to uneven brightness. In an embodiment, the process of pre-filtering may be used to smooth processing, or remove the sharp changes of the gray level within or at the edge of the line caused by image noise. In an embodiment, a strong light source, side light source, focus light source or using monochromatic light and filter may be used on the CCD camera.

Figure 7:
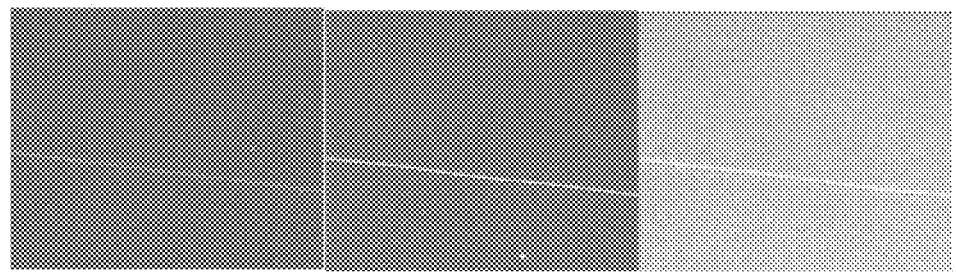
FIG. 7 illustrates exemplary images of the first line laser scribed on the solar panel according to an embodiment of the present application.
Figure 8:
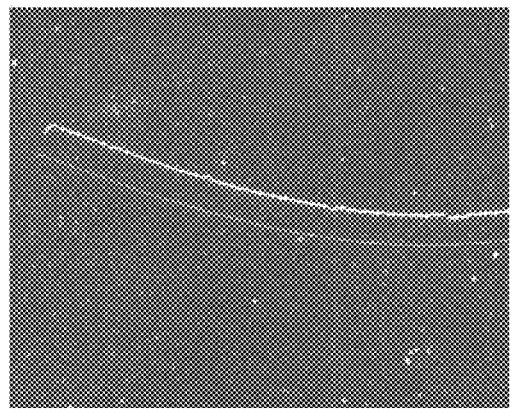
FIG. 8 illustrates exemplary images of the first and second lines laser scribed on the solar panel according to an embodiment of the present application.

In an embodiment of the present application, the laser scriber 205 may laser scribe the first line with the pre-designed shape on the solar panel. For example, the P1 line may be laser scribed on the Mo back contact layer as designed. In another embodiment of the present application, the capturer 201 may capture images of parts of the second line scribed on the solar panel consecutively. The acquirer 203 may acquire location information of each of the captured images of the second line. The laser scriber 205 may laser-scribe parts of a third line on the solar panel consecutively, according to each of the acquired location information of the second line, so that the scribed third line has a same shape with that of the second line and maintains a fixed distance from the second line. In an embodiment, the first line may be a P1 line, the second line may be a P2 line and the third line may be a P3 line. The exemplary P1 line and the exemplary images of three lines, P1, P2 and P3 lines which are laser scribed on the solar panel are illustrated in FIGS. 7 and 8, respectively.

In an embodiment of the present application, the system 200 may further include a stitching device (not shown). The stitching device may stitch the respective images of the parts of the first line which have been captured so that the complete image of the first line is obtained. For example, the track of the current image may be directly connected with the real track of the previous image. The stitching device may be implemented by software and the stitching of the images may be realised by the software algorithm.

In an embodiment of the present application, the system 200 may further include a depositing device (not shown). The depositing device may deposit an absorption layer and a buffer layer on the laser scribed first line. It is appreciated that the deposition of absorption layer and buffer layer may be realised by any known system and method in the art, such as a vacuum-evaporation system and a chemical-bath-deposition method, respectively. In another embodiment, the depositing device may be omitted.

In an embodiment of the present application, the system 200 further includes a cleaning device which is arranged adjacent to the solar panel for removing ashes and dust generated during the laser-scribing.

Figure 3A:
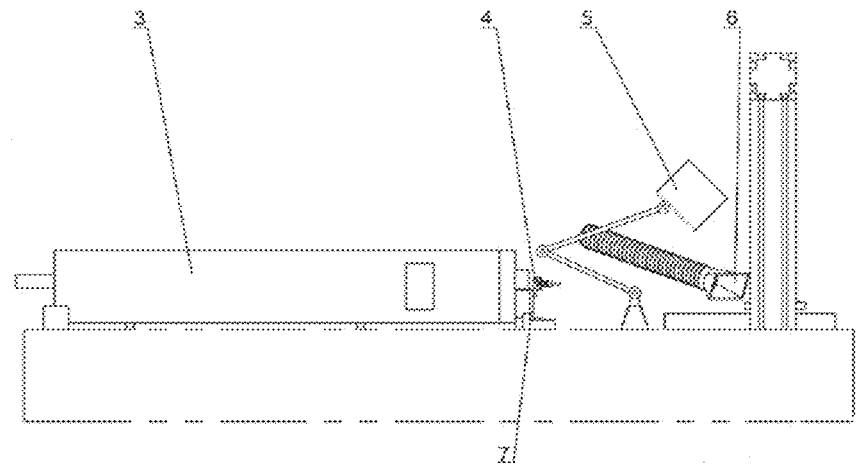
FIGS. 3A and 3B illustrate an exemplary system for laser-scribing a solar panel and an enlarged diagram of the system shown in FIG. 3A according to an embodiment of the present application, respectively.
Figure 3B:
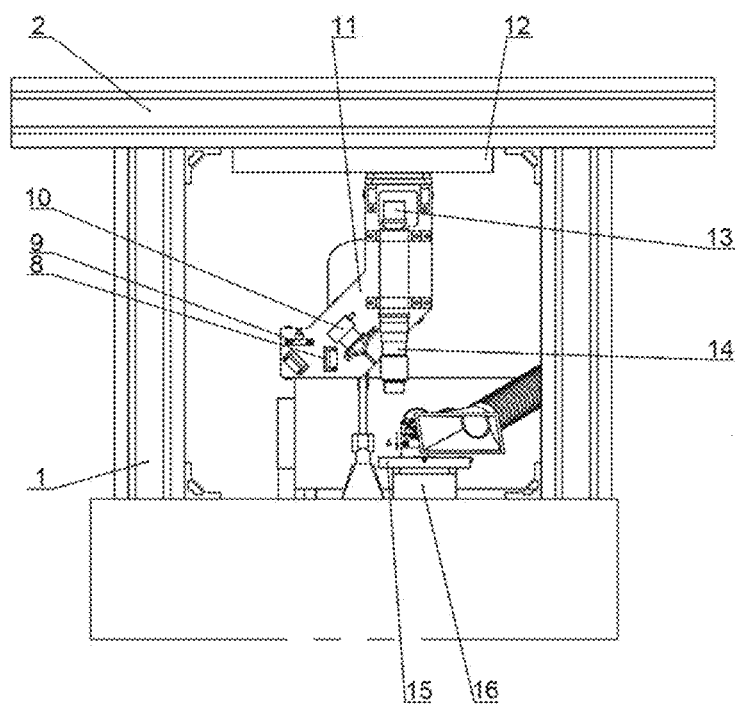

FIGS. 3A and 3B illustrate an exemplary system for laser-scribing a solar panel and an enlarged diagram of the system according to an embodiment of the present application, respectively. The disclosed and described system hereinafter is exemplary and those skilled in the art will understand and appreciate that the system according to the present application is not limited to this.

As shown in FIGS. 3A and 3B, in portal frames 1, 2 of the illustrated system 1000, a picosecond pulse laser is output from a laser head 3 and is lead to an optical fiber through a beam focus component 4. The laser passes through the optical fiber and exits after a beam collimating component 9, which can produce a parallel beam with a certain diameter (e.g. 3-20 mm). Then, this beam passes through a long focus lens 8 and incidents to the thin film solar panel. Meanwhile, the deflection direction of the beam is controlled by a scanning galvanometer 10. The solar panel is fixed on a jig 15 which is installed on a moving platform 16, to realize the scribing function. The moving platform 16 may be a linear guide. To maintain the same shape of P2 and P3 lines with P1 line, an imaging device, such as a high speed CCD camera 13 to perform high-speed photography for the first line, P1 line. The imaging device may be arranged on a tracking platform 12, which may be also a linear guide. During the photographing, a high brightness LED 5 is arranged adjacent to the solar panel to ensure the images clear and identifiable. In addition, a cleaning device, such as an air extracting device 6 is arranged to remove the ashes and dust produced in the scribing process. The imaging device is fixed on an L-shaped junction plate 11, which is connected to the tracking platform 12. The tracking and moving platforms are installed on the portal frame 1, 2 and locked up with an optical table. The tracking and moving platforms, i.e., the two linear guides 12, 16 are placed orthogonal with each other, and the speed and positions of these platforms can be controlled accurately by a software on a computer (not shown) for realizing arbitrary shaped patterns. Together with the scanning galvanometer 10, the system can realize precise control the laser-scribing of the P2 and P3 lines, ensuring the consistency with P1 lines. In an embodiment, the camera may move with the tracking platform.

With the system for laser-scribing the solar panel of the present application, the arbitrary patterns serving the function of solar panel can be designed freely and the artistic quality on the substrates with different sizes and shapes can be increased, thereby making the produced solar panels more convenient and attractive to consumers and improving the yield and efficiency of the solar panel. In an alternative embodiment, the thin film solar panels may be, but not limited to, CdTe or CIGS. In an alternative embodiment, one-dimensional vibrating mirror or two-dimensional galvanometer, a plane array scanning camera or a line scanning camera, or displacement platforms (by lead screw linear guide, linear guide or slide rail) may be used.

Figure 4:
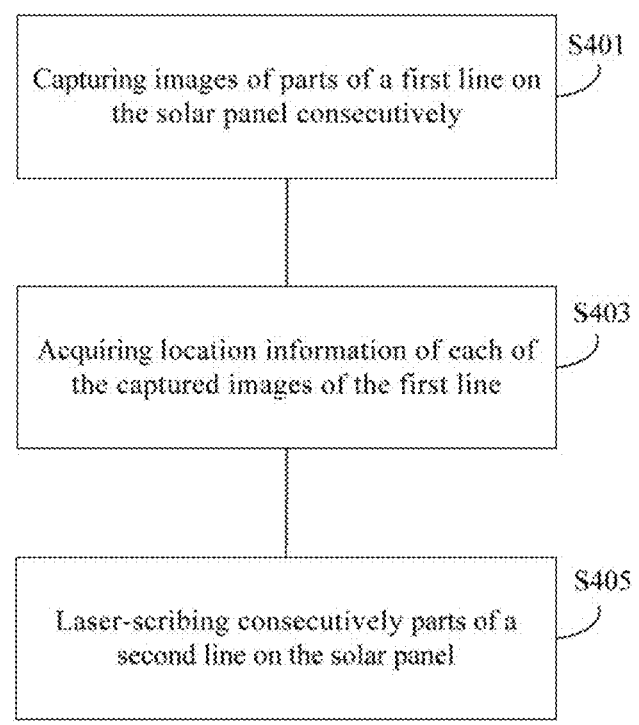
FIG. 4 illustrates a schematic flowchart of the method for laser-scribing according to an exemplary embodiment of the present application.
Figure 5:
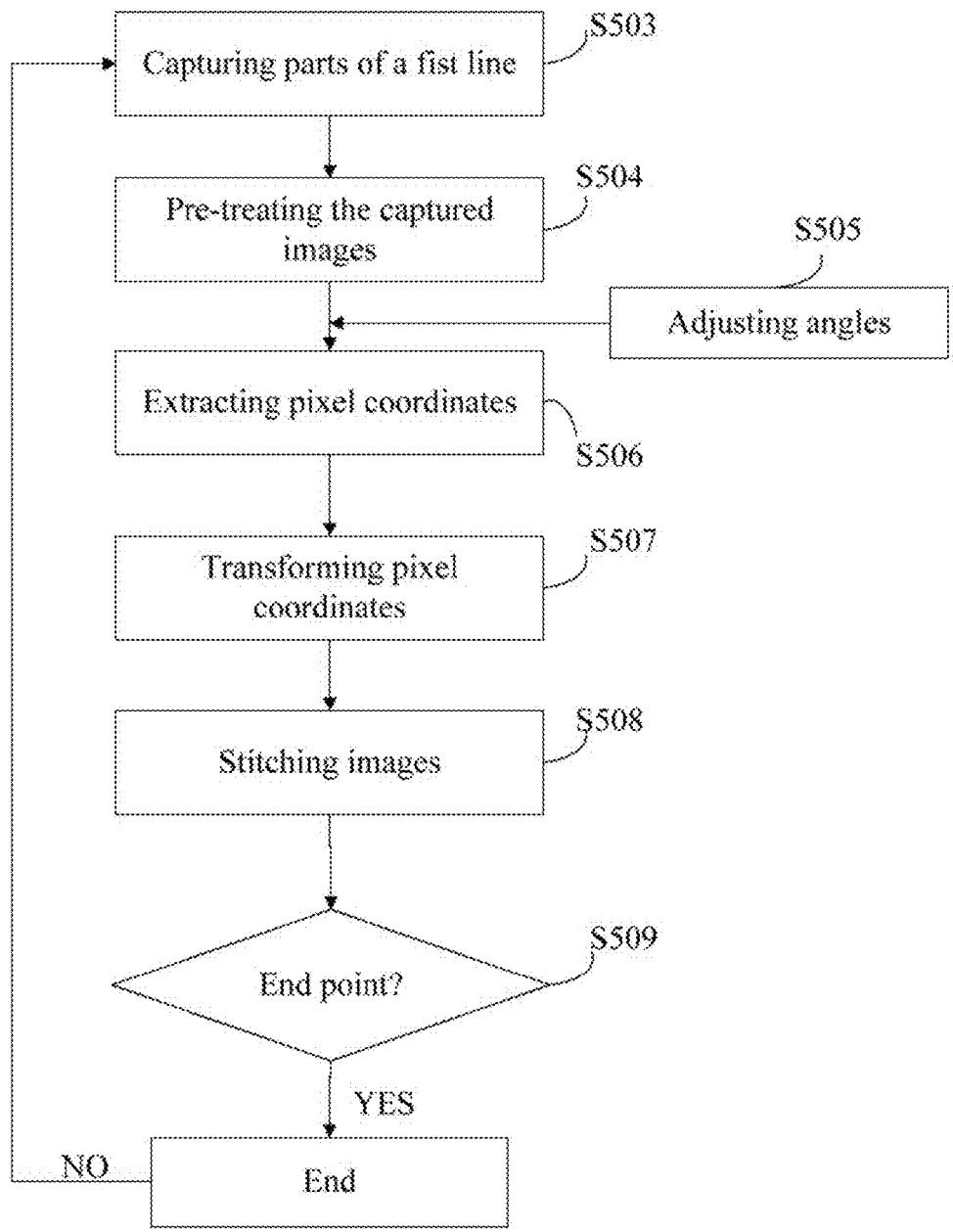
FIG. 5 illustrates a schematic flowchart of tracking the first line on according to an exemplary embodiment of the present application.

Turning now to FIGS. 4 and 5, illustrated are exemplary methods for laser-scribing the solar panel and exemplary processes for tracking the first line. While, for purposes of simplicity of explanation, the disclosed methods are shown and described as a series of acts, the disclosed subject matter is not limited by the order of acts, as some acts may occur in different orders and/or concurrently with other acts from that shown and described herein. For example, those skilled in the art will understand and appreciate that a method can alternatively be represented as a series of interrelated states or events, such as in a state diagram. Moreover, not all illustrated acts may be required to implement a method in accordance with the disclosed subject matter.

Referring to FIG. 4, in step S401, images of parts of a first line on the solar panel are captured consecutively, wherein the first line has a pre-designed shape. In step S403, location information of each of the captured images of the first line is acquired. Then, in step S405, parts of a second line on the solar panel is laser-scribed consecutively, according to each of the acquired location information of the first line, so that the scribed second line has the pre-designed shape and maintains a fixed distance from the first line.

FIG. 5 illustrates an exemplary method 500 for tracking the first line on the solar panel according to an embodiment of the present application. Referring to FIG. 5, in step S503, the images of parts of the first line are captured consecutively. Then, in step S504, the captured images of the plurality of parts of the first line are pre-treated, including, but not limiting, pre-filtering, removing serious salt and pepper noise and balancing light conditions leading to uneven brightness. The process of pre-filtering may be used to smooth processing, or remove the sharp changes of the gray level within or at the edge of the line caused by image noise.

In step S505, the installation position and angle of the tracking platform (X/Y axis), the scanning galvanometer coordinates, the wide/high size of the CCD camera are calibrated. In the process of "calibrating", several lines are firstly scribed using a set of pre-decided parameters (maintaining the scanning galvanometer at zero), these lines are recorded by the CCD camera, and their position and spacing are calculated. So the scaling relation between the real coordinates and camera pixels can be obtained (pixel/mm). In addition, the zero position coordinates can also be obtained. At the same time, the angle between the lines coordinates and the wide/high direction can be calculated and used as the angle calibration. Then, several lines may be scribed using a set of pre-decided parameters (setting a non-zero parameter for scanning galvanometer), these lines are recorded by the CCD camera, and their position and spacing are calculated. So the scaling relation between the real coordinates and the coordinates of scanning galvanometer can be obtained (bit/mm). The whole scribing process can proceed successfully only if the above calibration is done.

Figure 6:
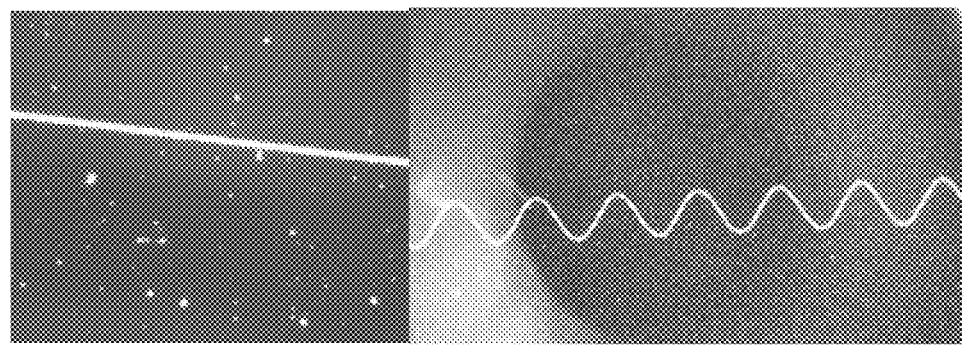
FIG. 6 depicts exemplary lines of the first line obtained using the tracking process illustrated in FIG. 5.

In step S506, pixel coordinates of the captured images of parts of the first line are extracted and the extracted pixel coordinates are transformed into scribing coordinates of parts in step S507 to acquire the location information of each image. Then, in step S508, the respective captured images of the parts of the first line are stitched together, so that the complete image of the first line is obtained. After that, whether end point of the first line has been captured is determined in step S509. If yes, the tracking process of the first line is finished. If no, the process returns to step S503 to proceed. FIG. 6 depicts exemplary lines of the first line obtained using the tracking process illustrated in FIG. 5.

In another embodiment, the first line, i.e., P1 line may laser scribed on a substrate of the solar panel, wherein the shape of the first line is pre-designed. After the first line has been scribed and before the second line is scribed, an absorption layer, such as a CIGS absorption layer and a buffer layer, such as a CdS buffer layer may be deposited on the laser scribed first line. In an embodiment, the CIGS absorption layer may be about 2-3 microns and the CdS buffer layer may be about 50 nm.

With the method for laser-scribing the solar panel of the present application, the arbitrary patterns serving the function of solar panel can be designed freely and the artistic quality on the substrates with different sizes and shapes can be increased, thereby making the produced solar panels more convenient and attractive to consumers and improving the yield and efficiency of the solar panel. In an alternative embodiment, the solar panels, including the thin film solar panels applicable for the method of the present application may be, but not limited to, CdTe or CIGS.

Figure 10:
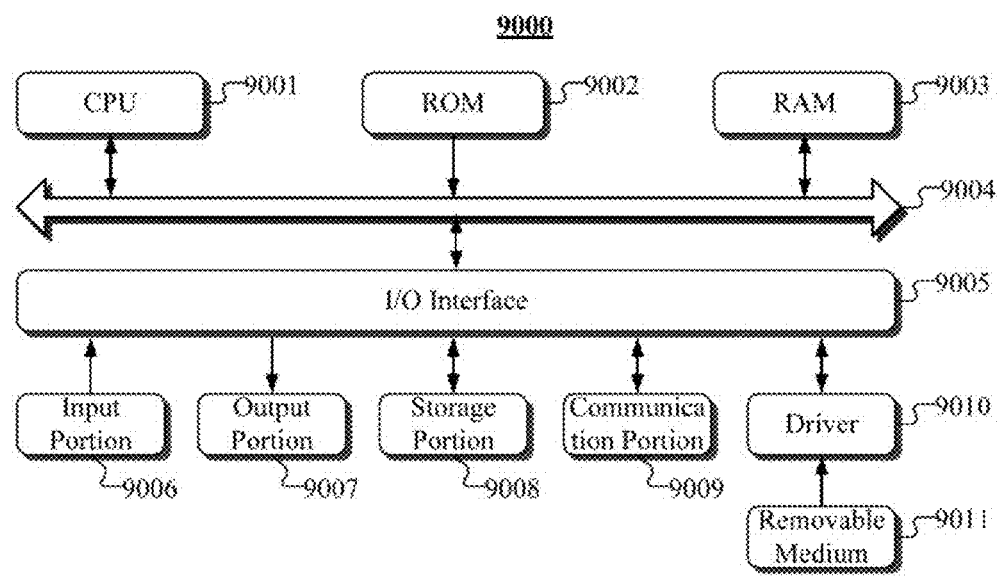
FIG. 10 illustrates a schematic structural diagram of a computer system that is adapted for implementing the method and the system according to an embodiment of the present application.

Referring now to FIG. 10, a schematic structural diagram of a computer system 9000 that is adapted for implementing the method and the system according to an embodiment of the present application is shown.

As shown in FIG. 10, the computer system 9000 comprises a central processing unit (CPU) 9001, which may perform a variety of appropriate actions and processes according to a program stored in a read only memory (ROM) 9002 or a program loaded to a random access memory (RAM) 9003 from a storage portion 9008. RAM 9003 also stores various programs and data required by operations of the system 9000. CPU 9001, ROM 9002 and RAM 9003 are connected to each other via a bus 9004. An input/output (I/O) interface 9005 is also connected to the bus 9004.

The following components are connected to the I/O interface 9005: an input portion 9006 comprising a keyboard, a mouse and the like, an output portion 9007 comprising a cathode ray tube (CRT), a liquid crystal display (LCD), a speaker and the like; the storage portion 9008 comprising a hard disk and the like; and a communication portion 9009 comprising a network interface card, such as a LAN card, a modem and the like. The communication portion 9009 performs communication process via a network, such as the Internet. A driver 9010 is also connected to the I/O interface 9005 as required. A removable medium 9011, such as a magnetic disk, an optical disk, a magneto-optical disk and a semiconductor memory, may be installed onto the driver 9010 as required, so as to install a computer program read therefrom to the storage portion 9008 as needed.

In particular, according to the embodiment of the present disclosure, the method described above with reference to FIGS. 2, 5 and 6 may be implemented as a computer software program. For example, the embodiment of the present disclosure comprises a computer program product, which comprises a computer program that tangibly included in a machine-readable medium. The computer program comprises program codes for executing the method in FIGS. 2, 5 and 6. In such embodiments, the computer program may be downloaded from the network via the communication portion 9009 and installed, and/or be installed from the removable medium 9011.

The flow charts and the block diagrams in the figures illustrate the system architectures, functions, and operations which may be achieved by the systems, devices, methods, and computer program products according to various embodiments of the present application. For this, each block of the flow charts or the block diagrams may represent a module, a program segment, or a portion of the codes which comprise one or more executable instructions for implementing the specified logical functions. It should also be noted that, in some alternative implementations, the functions denoted in the blocks may occur in a different sequence from that marked in the figures. For example, two blocks denoted in succession may be performed substantially in parallel, or in an opposite sequence, which depends on the related functions. It should also be noted that each block of the block diagrams and/or the flow charts and the combination thereof may be achieved by a specific system which is based on the hardware and performs the specified functions or operations, or by the combination of the specific hardware and the computer instructions.

The units or modules involved in the embodiments of the present application may be implemented in hardware or software. The described units or modules may also be provided in a processor. The names of these units or modules do not limit the units or modules themselves.

As another aspect, the present application further provides a computer readable storage medium, which may be a computer readable storage medium contained in the device described in the above embodiments; or a computer readable storage medium separately exists rather than being fitted into any terminal apparatus. One or more computer programs may be stored on the computer readable storage medium, and the programs are executed by one or more processors to perform the method described in the present application.

The above description is only the preferred embodiments of the present application and the description of the principles of applied techniques. It will be appreciated by those skilled in the art that, the scope of the claimed solutions as disclosed in the present application are not limited to those consisted of particular combinations of features described above, but should cover other solutions formed by any combination of features from the foregoing or an equivalent thereof without departing from the inventive concepts, for example, a solution formed by replacing one or more features as discussed in the above with one or more features with similar functions disclosed (but not limited to) in the present application.

What is claimed is:

1. A method for laser-scribing a solar panel, the method comprising:
    capturing consecutively images of parts of a first line on the solar panel, the first line having a pre-designed shape;
    acquiring location information of each of the captured images of the first line; and laser-scribing consecutively parts of a second line on the solar panel, according to the acquired location information of the first line, so that the scribed second line has the pre-designed shape of the first line and maintains a fixed distance from the first line.

2. The method according to claim 1, further comprising:
stitching the respective captured images of the parts of the first line so that the image of the first line is obtained.

3. The method according to claim 1, wherein the acquiring comprises:
extracting pixel coordinates of the captured images of each part of the first line; and
transforming the extracted pixel coordinates into scribing coordinates of each part to acquire the location information.

4. The method according to claim 1, further comprising:
capturing consecutively images of parts of the second line scribed on the solar panel;
acquiring location information of each of the captured images of the second line; and
laser-scribing consecutively parts of a third line on the solar panel, according to the acquired location information of the second line, so that the scribed third line has a same shape with that of the second line and maintains a fixed distance from the second line.

5. The method according to claim 1, further comprising removing sharp changes of a gray level within or at edges of the line caused by image noise, removing salt and pepper noise of the captured image and balancing light conditions leading to uneven brightness.

6. The method according to claim 1, wherein the pre-designed shape at least comprises wave-like, round, rectangular and polygonal shapes.

7. A system for laser-scribing a solar panel, comprising:
at least one processor; and
a memory storing instructions, which when executed by the at least one processor, cause the at least one processor to perform operations comprising:
capturing consecutively images of parts of a first line on the solar panel, the first line having a pre-designed shape;
acquiring location information of each of the captured images of the first line; and
laser-scribing consecutively parts of a second line on the solar panel, according to the acquired location information of the first line, so that the scribed second line has the pre-designed shape of the first line and maintains a fixed distance from the first line.

8. The system according to claim 7, wherein the operations further comprise stitching the respective captured images of the parts of the first line so that the image of the first line is obtained.

9. The system according to claim 7, wherein the operations further comprise extracting pixel coordinates of the captured images of each part of the first line; and transforming the extracted pixel coordinates into scribing coordinates of each part to acquire the location information.

10. The system according to claim 7, wherein the operations further comprise:
capturing consecutively images of parts of the second line scribed on the solar panel;
acquiring location information of each of the captured images of the second line; and
laser-scribing consecutively parts of a third line on the solar panel, according to the acquired location information of the second line, so that the scribed third line has a same shape with that of the second line and maintains a fixed distance from the second line.

11. A system for laser-scribing a solar panel, the system comprising:
a CCD imaging device for capturing consecutively images of lines on the solar panel;
a galvanometer for guiding a laser beam;
at least one processor; and
a memory storing instructions, which when executed by the at least one processor, cause the at least one processor to perform operations comprising:
capturing consecutively images of parts of a first line on the solar panel, the first line having a pre-designed shape;
acquiring location information of each of the images of the first line captured by the imaging device; and
scribing consecutively parts of a second line on the solar panel by the laser beam, according to the acquired location information of the first line, so that the scribed second line has the pre-designed shape of the first line and maintains a fixed distance from the first line.

12. The system according to claim 11, wherein the operations further comprise:
stitching the respective captured images of the parts of the first line so that the image of the first line is obtained.

13. The system according to claim 11, wherein the operations further comprise:
extracting pixel coordinates of the captured images of each part of the first line; and
transforming the extracted pixel coordinates into scribing coordinates of each part to acquire the location information.

14. The system according to claim 11, wherein the operations further comprise:
capturing consecutively images of parts of the second line scribed on the solar panel;
acquiring location information of each of the captured images of the second line; and
laser-scribing consecutively parts of a third line on the solar panel, according to the acquired location information of the second line, so that the scribed third line has a same shape with that of the second line and maintains a fixed distance from the second line.

15. The system of claim 11, wherein the operations further comprise:
calibrating scanning coordinates of the galvanometer and a wide/high size of the CCD imaging device.

16. The system of claim 15, wherein the calibrating further comprise:
setting the scanning coordinates of the galvanometer at zero;
capturing, by the CCD imaging device, images of lines scribed using a set of pre-determined parameters; and
obtaining a scaling relationship between real coordinates of the lines and pixels of the CCD imaging device based on positions and spacing of the captured lines.

17. The system of claim 15, wherein the calibrating further comprises:
setting the scanning coordinates of the galvanometer at non-zero;
capturing, by the CCD imaging device, images of lines scribed using a set of pre-determined parameters; and
obtaining a scaling relationship between the real coordinates of the lines and the coordinates of the galvanometer.

* * * * *